(12) United States Patent
Yamamoto

(10) Patent No.: US 11,004,806 B2
(45) Date of Patent: *May 11, 2021

(54) SEMICONDUCTOR DEVICE, MANUFACTURING METHOD OF SEMICONDUCTOR DEVICE, INTEGRATED SUBSTRATE, AND ELECTRONIC DEVICE

(71) Applicant: SONY CORPORATION, Tokyo (JP)

(72) Inventor: Yuichi Yamamoto, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/857,110

(22) Filed: Apr. 23, 2020

(65) Prior Publication Data
US 2020/0251428 A1    Aug. 6, 2020

Related U.S. Application Data

(63) Continuation of application No. 16/086,708, filed as application No. PCT/JP2017/010862 on Mar. 17, 2017, now Pat. No. 10,672,724.

(30) Foreign Application Priority Data

Mar. 31, 2016    (JP) .................................. 2016-072166

(51) Int. Cl.
*H01L 23/053*    (2006.01)
*H01L 23/00*    (2006.01)
(Continued)

(52) U.S. Cl.
CPC ............ *H01L 23/564* (2013.01); *H01L 21/52* (2013.01); *H01L 23/02* (2013.01); *H01L 23/053* (2013.01); *H01L 23/291* (2013.01); *H01L 23/3135* (2013.01); *H01L 23/49816* (2013.01); *H01L 27/14618* (2013.01); *H01L 27/14636* (2013.01);
(Continued)

(58) Field of Classification Search
CPC ..... H01L 21/52; H01L 21/56; H01L 2021/60; H01L 21/84; H01L 23/053; H01L 23/08; H01L 23/291; H01L 23/3107; H01L 23/3135; H01L 23/49811; H01L 23/49816; H01L 23/564; H01L 27/14618;
(Continued)

(56) References Cited

U.S. PATENT DOCUMENTS 9,991,301 B2    6/2018    Yamamoto et al.
10,672,724 B2 *  6/2020    Yamamoto ........ H01L 27/14618
(Continued)

*Primary Examiner* — Stephen W Smoot
(74) *Attorney, Agent, or Firm* — Sheridan Ross P.C.

(57) ABSTRACT

The present technology relates to a semiconductor device, a manufacturing method of a semiconductor device, an integrated substrate, and an electronic device capable of improving moisture resistance of the semiconductor device. The semiconductor device includes a semiconductor chip and a protective member which is a transparent member having moisture resistance and covers at least one of a first surface perpendicular to a side surface of the semiconductor chip or a second surface opposite to the first surface and the side surfaces. The electronic device includes the semiconductor device and the signal processing unit. The present technology is applied to, for example, an imaging element and an electronic device including an imaging element.

8 Claims, 18 Drawing Sheets

(51) Int. Cl.
  *H01L 23/02* (2006.01)
  *H01L 23/31* (2006.01)
  *H01L 23/29* (2006.01)
  *H01L 21/52* (2006.01)
  *H01L 23/498* (2006.01)
  *H01L 27/146* (2006.01)
  H01L 21/56 (2006.01)
  H01L 21/60 (2006.01)

(52) U.S. Cl.
  CPC ...... *H01L 27/14683* (2013.01); *H01L 21/561* (2013.01); *H01L 23/3107* (2013.01); *H01L 2021/60* (2013.01); *H01L 2224/97* (2013.01); *H01L 2924/15153* (2013.01)

(58) Field of Classification Search
  CPC ......... H01L 27/14636; H01L 27/14683; H01L 2224/97; H01L 2924/15153; H01L 2924/186
  See application file for complete search history.

(56) References Cited

U.S. PATENT DOCUMENTS

| | | |
|---|---|---|
| 2004/0245530 A1 | 12/2004 | Kameyama et al. |
| 2006/0211173 A1 | 9/2006 | Hsiao et al. |
| 2008/0237768 A1 | 10/2008 | Yajima et al. |
| 2013/0127879 A1 | 5/2013 | Burns et al. |
| 2015/0049374 A1 | 2/2015 | Hofman et al. |

\* cited by examiner

SEMICONDUCTOR DEVICE, MANUFACTURING METHOD OF SEMICONDUCTOR DEVICE, INTEGRATED SUBSTRATE, AND ELECTRONIC DEVICE

CROSS REFERENCE TO RELATED APPLICATIONS

This application is a continuation of U.S. application Ser. No. 16/086,708 filed Sep. 20, 2018, now U.S. Pat. No. 10,672,724, which is a national stage application under 35 U.S.C. 371 and claims the benefit of PCT Application No. PCT/JP2017/010862 having an international filing date of 17 Mar. 2017, which designated the United States, which PCT application claimed the benefit of Japanese Patent Application No. 2016-072166 filed 31 Mar. 2016, the entire disclosures of each of which are incorporated herein by reference.

TECHNICAL FIELD

The present technology relates to a semiconductor device, a manufacturing method of a semiconductor device, an integrated substrate, and an electronic device, and more particularly, to a semiconductor device, a manufacturing method of a semiconductor device, an integrated substrate, and an electronic device capable of improving moisture resistance.

BACKGROUND ART

Conventionally, it has been proposed that a groove is provided in a scribe region of a wafer and a protective film is formed in the groove to protect side surfaces of the scribed semiconductor chip with the protective film and to improve moisture-proof performance (for example, Patent Document 1).

CITATION LIST

Patent Document

Patent Document 1: International Publication No. 2015/111419

SUMMARY OF THE INVENTION

Problems to be Solved by the Invention

However, according to the invention disclosed in Patent Document 1, a part of the side surface of the semiconductor chip is not covered with the protective film and is exposed, and there is a possibility that moisture enters the semiconductor chip.

Therefore, the present technology improves moisture resistance of a semiconductor device.

Solutions to Problems

A semiconductor device according to a first aspect of the present technology includes a semiconductor chip and a protective member which is a transparent member having moisture resistance and covers at least one of a first surface perpendicular to a side surface of the semiconductor chip or a second surface opposite to the first surface and the side surfaces.

A wiring layer formed from the side of one of the first surface and the second surface which is not covered with the protective member can be further provided.

A protective film which covers an adhesion portion between the semiconductor chip and the protective member on a side of the surface which is not covered with the protective member can be further provided.

Both of the first surface and the second surface are covered with the protective member, and a wiring layer formed from the side of the second surface of the protective member can be further provided.

A gap can be provided between the first surface and the side surface, and the protective member.

The protective member can include glass.

The semiconductor chip can configure an imaging element.

A manufacturing method of a semiconductor device according to a second aspect of the present technology includes a groove forming step of forming a plurality of grooves into which a semiconductor chip is inserted into a predetermined surface of a first substrate which is a transparent substrate having moisture resistance, a first bonding step of bonding each of the plurality of semiconductor chips into the groove, and a lowering step of making a height of each semiconductor chip match a height of the predetermined surface of the substrate by lowering the height of at least one of the semiconductor chip or the substrate.

A wiring step of forming a wiring layer of each of the semiconductor chips on the substrate from the side of the predetermined surface can be further provided subsequent to the lowering step.

A protective film forming step of forming a protective film around each of the semiconductor chips and on the predetermined surface of the first substrate can be further provided subsequent to the lowering step.

A second bonding step of bonding a second substrate configured of the same material as the first substrate on the predetermined surface of the first substrate and a wiring step of forming a wiring layer of each of the semiconductor chips from the side of the second substrate can be further provided subsequent to the lowering step.

A cutting step of cutting and dividing the first substrate between the adjacent semiconductor chips can be further provided subsequent to the lowering step.

A manufacturing method of a semiconductor device according to a third aspect of the present technology includes a first bonding step of bonding a plurality of semiconductor chips on a predetermined surface of a first substrate which is a transparent substrate having moisture resistance and a second boding step of bonding a second substrate configured of the same material as the first substrate and including a plurality of grooves covering each of the semiconductor chips as having a gap with the semiconductor chips to the predetermined surface of the first substrate.

A wiring step of forming a wiring layer of each of the semiconductor chips from the side of the first substrate can be further provided subsequent to the second bonding step.

A cutting step of cutting and dividing the first substrate and the second substrate between the adjacent semiconductor chips can be further provided subsequent to the wiring step.

An integrated substrate according to a fourth aspect of the present technology includes a first substrate that is a transparent substrate having moisture resistance and having a plurality of grooves formed on a predetermined surface and a plurality of semiconductor chips arranged in the grooves of the substrate and including side surfaces and a first surface perpendicular to the side surface covered with an inner surface of the groove.

A second substrate configured of the same material as the first substrate, bonded to the predetermined surface of the first substrate, and covering a second surface of each of the semiconductor chips opposite to the first surface can be further provided.

A gap can be provided between each of the semiconductor chips and the groove of the first substrate.

The first substrate can include glass.

An electronic device according to a fifth aspect of the present technology includes a semiconductor device and a signal processing unit which processes a signal of the semiconductor device, in which the semiconductor device includes a semiconductor chip and a protective member that is a transparent protective member having moisture resistance configured to cover at least one of a first surface perpendicular to a side surface of the semiconductor chip or a second surface opposite to the first surface and the side surfaces.

In the first aspect of the present technology, at least one of a first surface perpendicular to a side surface of the semiconductor chip or a second surface opposite to the first surface and the side surfaces are covered with a protective member.

In the second aspect of the present technology, a plurality of grooves to which the semiconductor chip is inserted is formed on a predetermined surface of the transparent first substrate having moisture resistance, the plurality of semiconductor chips is bonded into each of the grooves, and at least one of heights of the semiconductor chip or the substrate is lowered so that the height of the semiconductor chip matches the height of the predetermined surface of the substrate.

In the third aspect of the present technology, a plurality of semiconductor chips is bonded to a predetermined surface of the transparent first substrate having moisture resistance, and a second substrate which is configured of the same material as the first substrate and includes the plurality of grooves covering each of the semiconductor chip with a gap with each of the semiconductor chips is bonded to the predetermined surface of the first substrate.

In the fourth aspect of the present technology, side surfaces and a first surface perpendicular to the side surface of each semiconductor chip are covered with an inner surface of a groove in the first substrate.

In the fourth aspect of the present technology, at least one of a first surface perpendicular to a side surface of the semiconductor chip of an electronic device or a second surface opposite to the first surface and the side surfaces are covered with a protective member.

Effects of the Invention

According to the first aspect to the fifth aspect of the present technology, the moisture resistance of the semiconductor device can be improved.

Note that the effects described herein are not necessarily limited and may be any effects described in the present disclosure.

MODE FOR CARRYING OUT THE INVENTION

A mode for carrying out the invention (referred to as embodiments below) will be described in detail below with reference to the drawings. Note that the description will be made in the following order.

1. First Embodiment
2. Second Embodiment (example in which a protective member and an adhesion portion are covered with a protective film on a mounting surface of a semiconductor device)
3. Third Embodiment (example using a WCSP chip)
4. Fourth Embodiment (example in which an entire surface of a semiconductor chip is covered with a protective film)
5. Fifth Embodiment (first example applied to a semiconductor device with a cavity structure)
6. Sixth Embodiment (second example applied to a semiconductor device having a cavity structure)
7. Application Example of Present Technology
8. Modification 1. First Embodiment First, a first embodiment of the present technology will be described with reference to FIGS. 1 to 4.

{Exemplary Configuration of Semiconductor Device 100}

Figure 1:
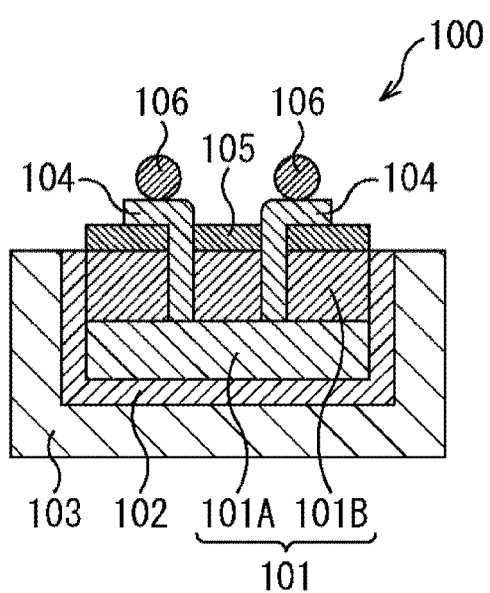
FIG. 1 is a schematic cross-sectional diagram of a first embodiment of a semiconductor device to which the present technology is applied.

FIG. 1 is a schematic cross-sectional diagram of a semiconductor device 100 to which the present technology is applied.

The semiconductor device 100 includes a semiconductor chip 101, an adhesion portion 102, a protective member 103, a rewiring layer 104, a solder mask 105, and a solder ball 106.

The semiconductor chip 101 is also referred to as a semiconductor die or simply referred to as a die, and includes a device portion 101A and a semiconductor substrate 101B. On the device portion 101A, for example, a main element, a circuit, and the like of the semiconductor chip 101 are formed. For example, in a case where the semiconductor device 100 is an imaging element, a photodiode, a transistor, a gate electrode, a color filter, an on-chip lens, a wiring, and the like are formed on the device portion 101A.

The semiconductor substrate 101B includes, for example, a silicon substrate, and is used as a support substrate and the like for supporting the device portion 101A.

A surface of the semiconductor chip 101 to be mounted on the substrate, that is, a surface opposite to the mounting surface perpendicular to a side surface (referred to as surface of device portion 101A below) and the side surfaces are completely covered with the glass protective member 103. The semiconductor chip 101 and the protective member 103 are bonded, for example, with the adhesion portion 102 formed on an adhesive.

The rewiring layer 104 passes through the semiconductor substrate 101B and connects the device portion 101A to the mounting surface of the semiconductor device 100. Note that in a portion where the rewiring layer 104 passes through the semiconductor substrate 101B, an insulation member is arranged between the rewiring layer 104 and the semiconductor substrate 101B, illustration of the insulation member is omitted in FIG. 1.

The solder mask 105 covers a portion of the mounting surface of the semiconductor chip 101 where the rewiring layer 104 is not formed and protects the mounting surface.

The solder ball 106 is provided in a portion of the rewiring layer 104 exposed from the solder mask 105.

{Manufacturing Method of Semiconductor Device 100}

Figure 2:
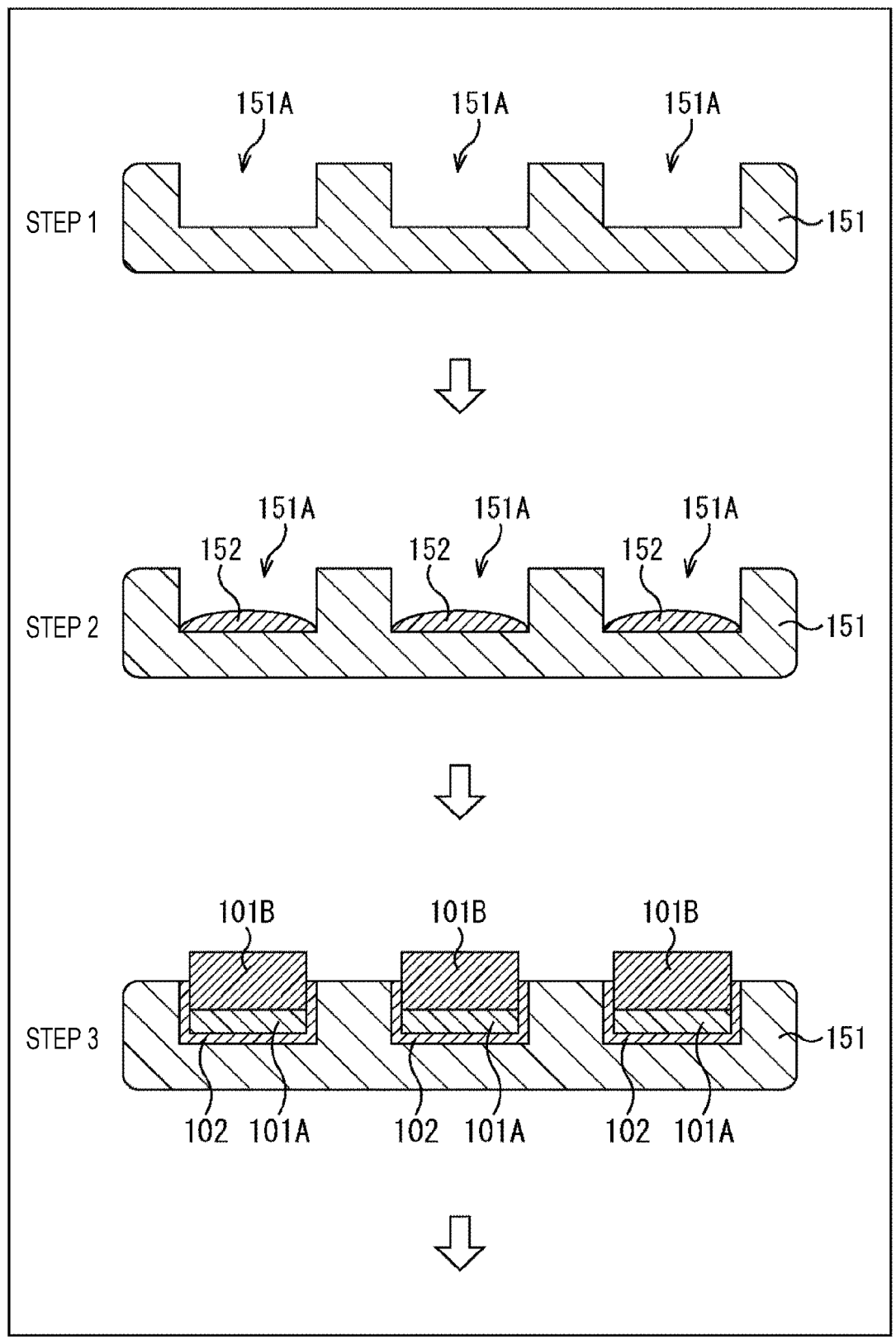
FIG. 2 is a diagram for explaining a manufacturing method of the semiconductor device in FIG. 1.

Next, a manufacturing method of the semiconductor device 100 will be described with reference to FIGS. 2 to 4.

In step 1, a plurality of grooves 151A, to which the semiconductor chip 101 is inserted, is formed in a glass substrate 151 used as the protective member 103 of the semiconductor device 100. An outer periphery of the groove 151A is slightly larger than an outer periphery of the semiconductor chip 101, and a depth of the groove 151A is deeper than the height of the device portion 101A of the semiconductor chip 101 and shallower than the height of the entire semiconductor chip 101.

In step 2, an adhesive 152 is applied in each groove 151A of the glass substrate 151.

In step 3, the semiconductor chip 101 is inserted into each groove 151A of the glass substrate 151 so that the surface of the device portion 101A faces to a bottom surface of the groove 151A. At this time, the adhesive 152 is pressed by the semiconductor chip 101, spreads over the entire inner surface of the groove 151A, and forms the adhesion portion 102. Then, the semiconductor chip 101 is bonded to the inside of the groove 151A of the glass substrate 151 via the adhesion portion 102.

In step 4, the height of the semiconductor substrate 101B is lowered. In other words, a portion of the semiconductor substrate 101B which protrudes from the groove 151A is removed so that the height of the surface of the semiconductor substrate 101B is the same as the height of the surface of the glass substrate 151. With this removal, the side surface of each semiconductor substrate 101B and the surface of the device portion 101A is covered with an inner surface of the groove 151A.

Note that, in the step 4, for example, the height of the surface of the semiconductor substrate 101B may match the height of the surface of the glass substrate 151 by lowering both of the semiconductor substrate 101B of the semiconductor chip 101 and the glass substrate 151. Alternatively, for example, in a case where the height of the semiconductor chip 101 is lower than the depth of the groove 151A, the height of the surface of the semiconductor substrate 101B may match the height of the surface of the glass substrate 151 by lowering the height of the glass substrate 151.

In step 5, the rewiring layer 104 and the solder mask 105 are formed. For example, the rewiring layer 104 to connect the mounting surface of the semiconductor chip 101 to the device portion 101A is formed on a side of the mounting surface of the semiconductor chip 101 (surface which is not covered with glass substrate 151). Note that, in step 5, for example, after the insulation member arranged between the rewiring layer 104 and the semiconductor substrate 101B has been formed, the rewiring layer 104 is formed. However, the illustration of the insulation member is omitted in FIG. 3. Furthermore, the solder mask 105 is formed on a portion of the mounting surface of the semiconductor chip 101 where the rewiring layer 104 is not formed.

In step 6, the solder ball 106 to mount the semiconductor device 100 on the substrate is provided on the surface of the rewiring layer 104.

In step 7, the height of the glass substrate 151 is lowered as necessary. In other words, the bottom surface side of the glass substrate 151 is lowered, and the glass substrate 151 is thinned. Note that, it is not necessary to perform step 7. Furthermore, step 7 may be performed between steps 4 and 5.

In step 8, dicing is performed. In other words, the glass substrate 151 is cut between the adjacent semiconductor chips 101, and the semiconductor device 100 is divided into individual pieces.

Note that the above steps may be performed by a single company or factory, and may be separately performed by a plurality of companies or factories. For example, it is possible that the single company or factory performs steps 1 to 4 or steps 1 to 7 and the substrate (integrated substrate), on which the plurality of semiconductor chips 101 is provided, obtained at that stage is shipped, and the subsequent steps may be performed by the other company or factory.

As described above, since the side surfaces of the semiconductor device 100 and the surface of the device portion 101A are completely covered with the protective member 103, performance for preventing entrance of moisture into the semiconductor device 100, in other words, moisture resistance is improved. Furthermore, the protective member 103 makes it difficult for the surface of the semiconductor device 100 to be scratched.

Accordingly, for example, the semiconductor device 100 can be used as an electronic device by directly mounting on an electronic substrate without sealing the semiconductor device 100 in a general semiconductor package.

Furthermore, since only the glass substrate 151 is cut in step 8 (dicing step), the workability is excellent, and quality of the semiconductor device 100 is improved.

2. Second Embodiment

Next, a second embodiment of the present technology will be described with reference to FIG. 5.

Figure 5:
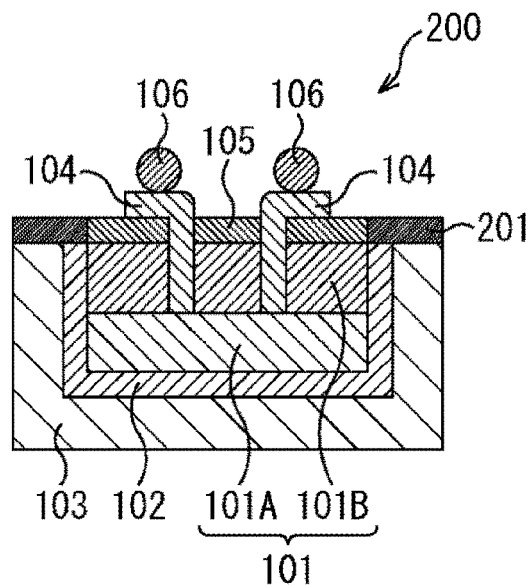
FIG. 5 is a schematic cross-sectional diagram of a second embodiment of a semiconductor device to which the present technology is applied.

FIG. 5 is a schematic cross-sectional diagram of a semiconductor device 200 to which the present technology is applied. Note that, in FIG. 5, components corresponding to those in FIG. 1 are respectively denoted with the same reference numerals.

The semiconductor device 200 is different from the semiconductor device 100 in FIG. 1 in that a protective film 201 is formed on a mounting surface of the semiconductor device 200. The protective film 201 includes, for example, a film of SiN, and completely covers surfaces of an adhesion portion 102 and a protective member 103 provided on the side of the mounting surface of the semiconductor device 200 (surface which is not covered with protective member 103).

Figure 3:
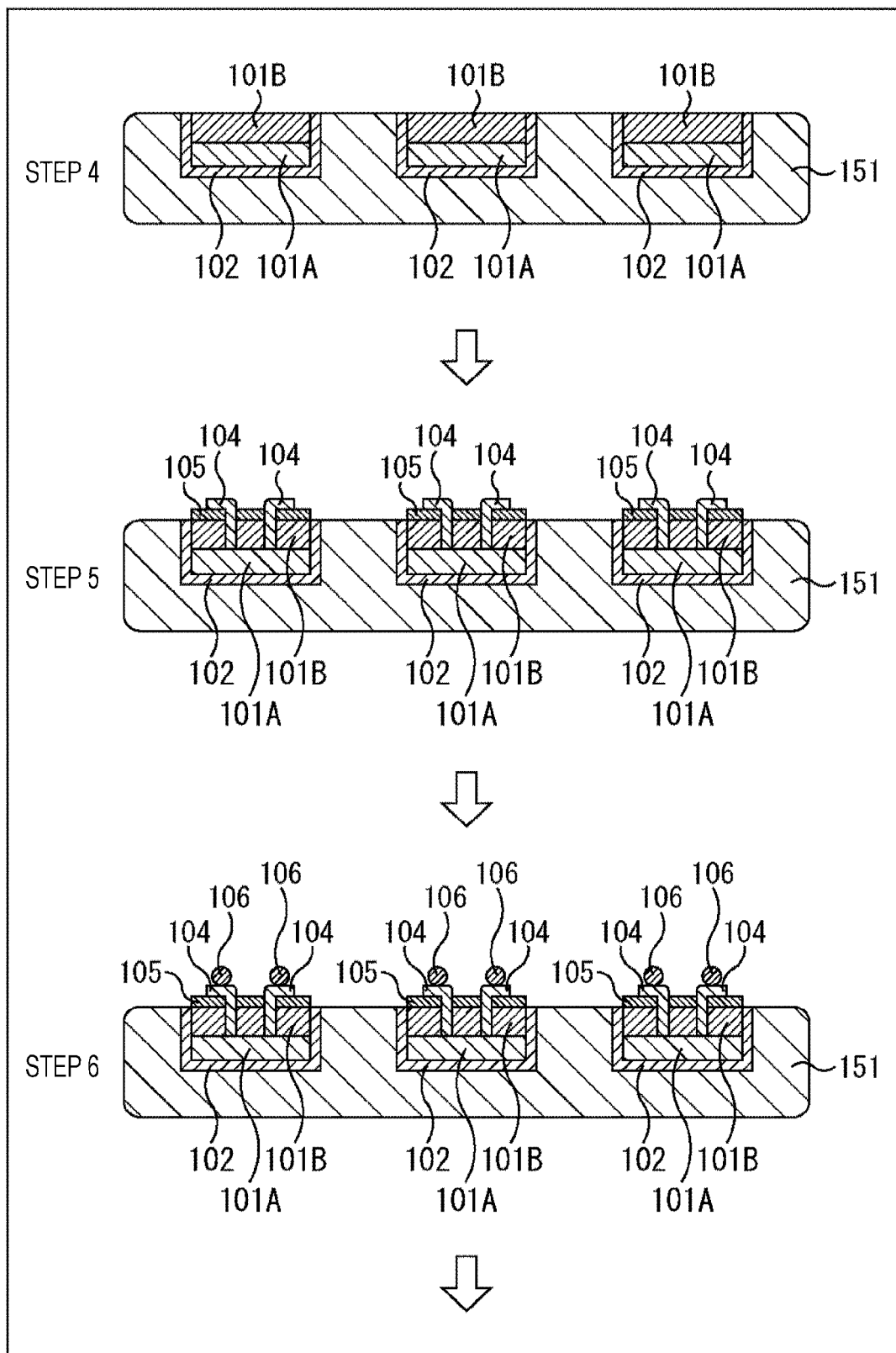
FIG. 3 is a diagram for explaining the manufacturing method of the semiconductor device in FIG. 1.

For example, after steps 4 or 5 in FIG. 3, the protective film 201 is formed around each semiconductor chip 101 (between semiconductor chips 101) on a surface of a glass substrate 151 where grooves are formed.

As a result, entrance of mounting surface from the mounting surface of the semiconductor device 200 can be prevented, and moisture resistance is further improved.

Note that it is preferable that the protective film 201 completely cover at least the adhesion portion 102 on the mounting surface of the semiconductor device 200, and it is not necessary for the protective film 201 to completely cover the protective member 103.

3. Third Embodiment

Next, a third embodiment of the present technology will be described with reference to FIG. 6.

Figure 6:
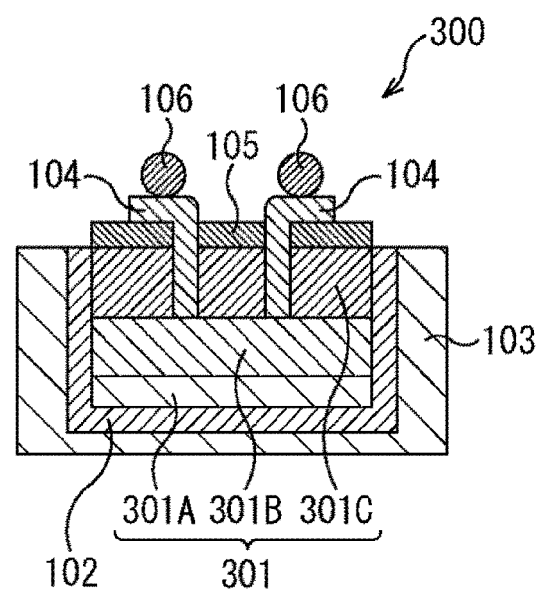
FIG. 6 is a schematic cross-sectional diagram of a third embodiment of a semiconductor device to which the present technology is applied.

FIG. 6 is a schematic cross-sectional diagram of a semiconductor device 300 to which the present technology is applied. Note that, in FIG. 5, components corresponding to those in FIG. 1 are respectively denoted with the same reference numerals.

The semiconductor device 300 is different from the semiconductor device 100 in FIG. 1 in that a semiconductor chip 301 is provided instead of the semiconductor chip 101

The semiconductor chip 301 is manufactured using a wafer level chip scale package (WCSP) technology and includes a cover glass 301A, a device portion 301B, and a semiconductor substrate 301C which are stacked. In other words, the semiconductor chip 301 is different from the semiconductor chip 101 in that the surface of the device portion 301B is covered with the cover glass 301A and is protected.

Then, side surfaces of the semiconductor chip 301 and a surface of the cover glass 301A are completely covered with the protective member 103, and water resistance is improved.

Note that, as in the second embodiment described above, a protective film covering the surfaces of the adhesion portion 102 and the protective member 103 on the side of the mounting surface of the semiconductor device 300 may be provided.

4. Fourth Embodiment

Figure 8:
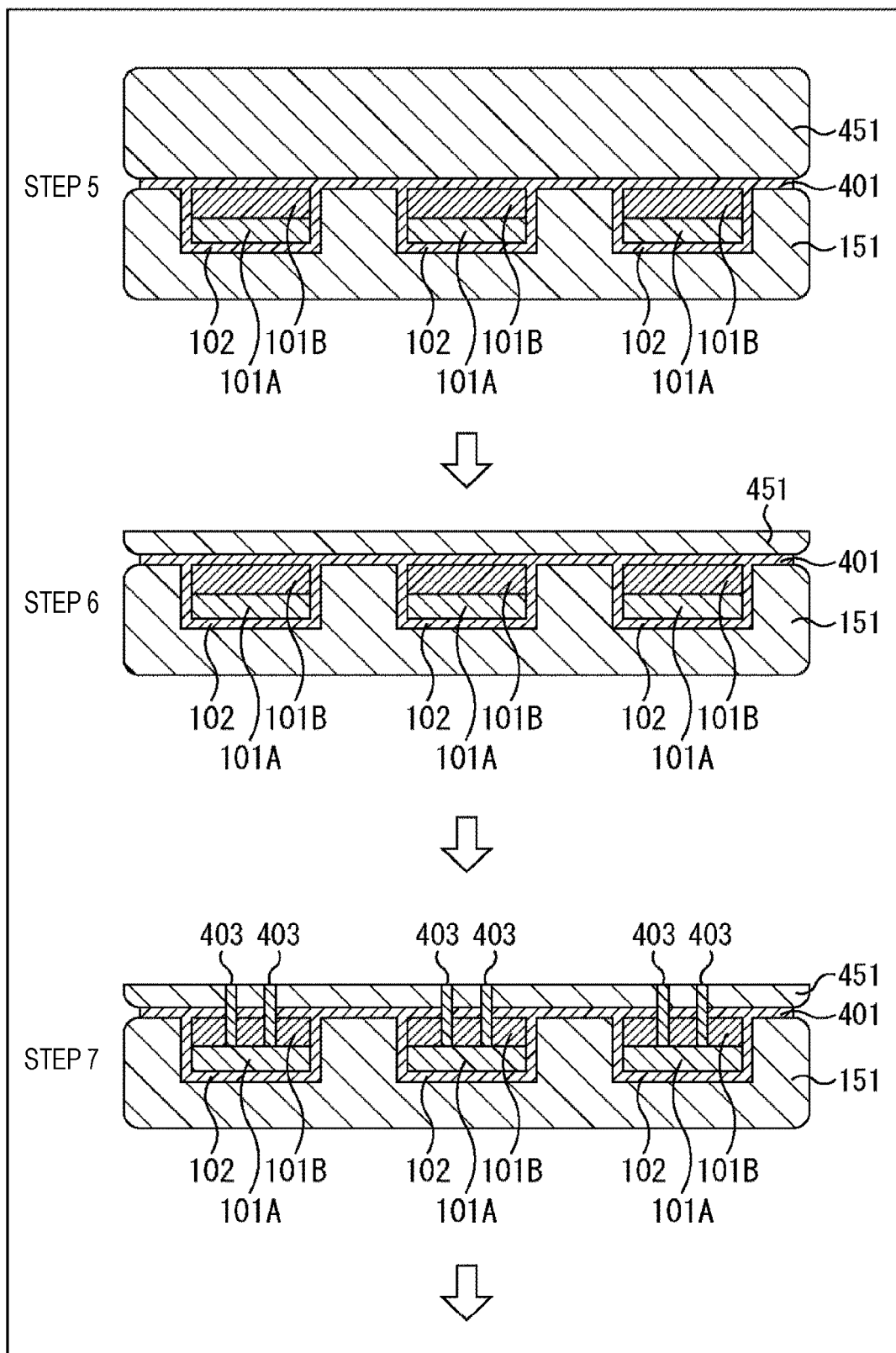
FIG. 8 is a diagram for explaining a manufacturing method of the semiconductor device in FIG. 7.
Figure 9:
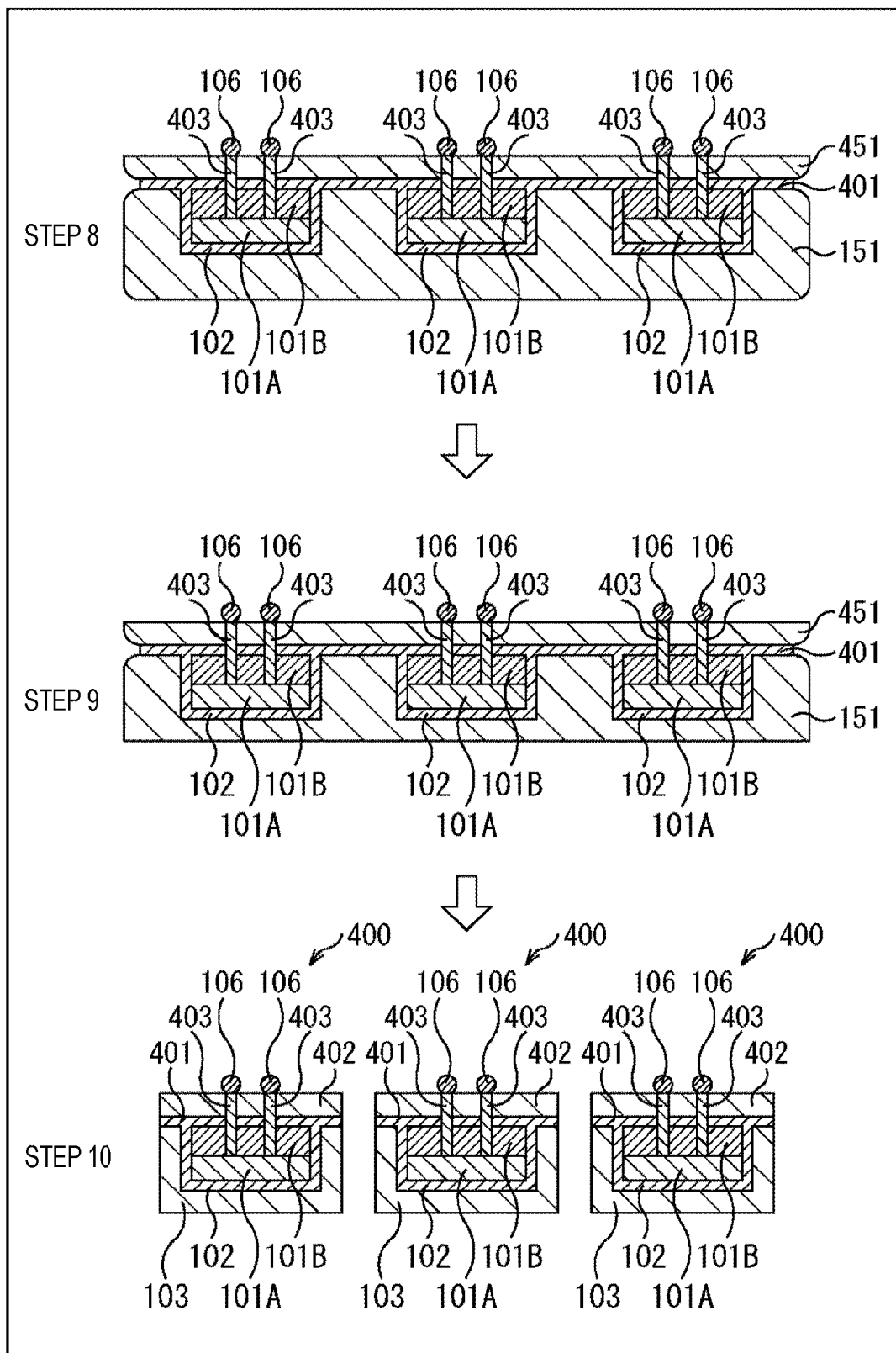
FIG. 9 is a diagram for explaining the manufacturing method of the semiconductor device in FIG. 7.

Next, a fourth embodiment of the present technology will be described with reference to FIGS. 7 to 9.

{Exemplary Configuration of Semiconductor Device 400}

Figure 7:
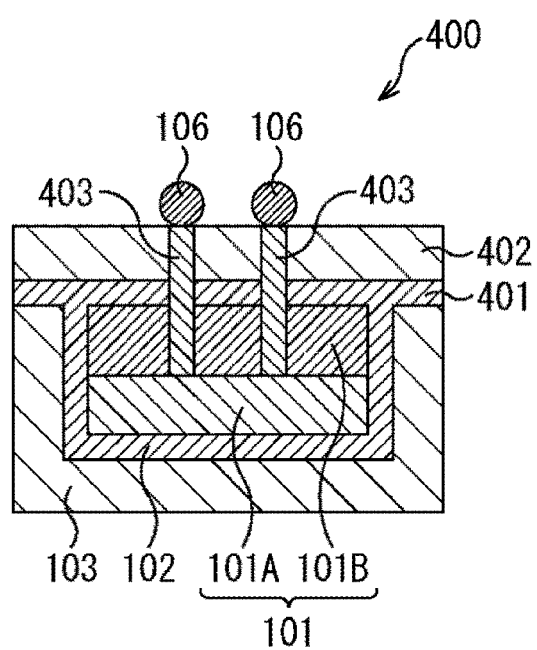
FIG. 7 is a schematic cross-sectional diagram of a fourth embodiment of a semiconductor device to which the present technology is applied.

FIG. 7 is a schematic cross-sectional diagram of a semiconductor device 400 to which the present technology is applied. Note that, in FIG. 5, components corresponding to those in FIG. 1 are respectively denoted with the same reference numerals.

The semiconductor device 400 is different from the semiconductor device 100 in FIG. 1 in that an adhesion portion 401, a protective member 402, and a rewiring layer 403 are formed instead of the rewiring layer 104 and the solder mask 105.

Specifically, a mounting surface of a semiconductor chip 101 is covered with the glass protective member 402 via the adhesion portion 401, for example, including an adhesive. The protective member 402 covers not only the mounting surface of the semiconductor chip 101 but also surfaces of the adhesion portion 102 and the protective member 103 on the side of the mounting surface of the semiconductor device 400.

The rewiring layer 403 passes through a semiconductor substrate 101B, the adhesion portion 401, and the protective member 402 and connects a device portion 101A to the mounting surface of the semiconductor device 400.

The solder ball 106 is provided in a portion of the rewiring layer 403 exposed from the protective member 402.

{Manufacturing Method of Semiconductor Device 400}

Next, a manufacturing method of the semiconductor device 400 will be described with reference to FIGS. 8 and 9.

Note that steps 1 to 4 are similar to steps 1 to 4 regarding the semiconductor device 100 described above with reference to FIGS. 2 and 3.

In step 5, an adhesive member is applied on a surface of a glass substrate 151 where the semiconductor substrate 101B is exposed (side where groove 151A is formed), and the adhesion portion 401 is formed. Then, a glass substrate 451 used for the protective member 402 of the semiconductor device 400 is bonded on the adhesion portion 401. Thus, the glass substrates 151 and 451 are bonded to each other via the adhesion portion 401, and surrounding of each semiconductor chip 101 is covered with the glass substrates 151 and 451.

In step 6, a thickness of the glass substrate 451 is reduced.

In step 7, the rewiring layer 403 is formed. For example, the rewiring layer 403 to connect the mounting surface of the semiconductor device 400 to the device portion 101A is formed from the side of the glass substrate 451.

In step 8, the solder ball 106 to mount the semiconductor device 400 on the substrate is provided on a surface of the rewiring layer 403.

Figure 4:
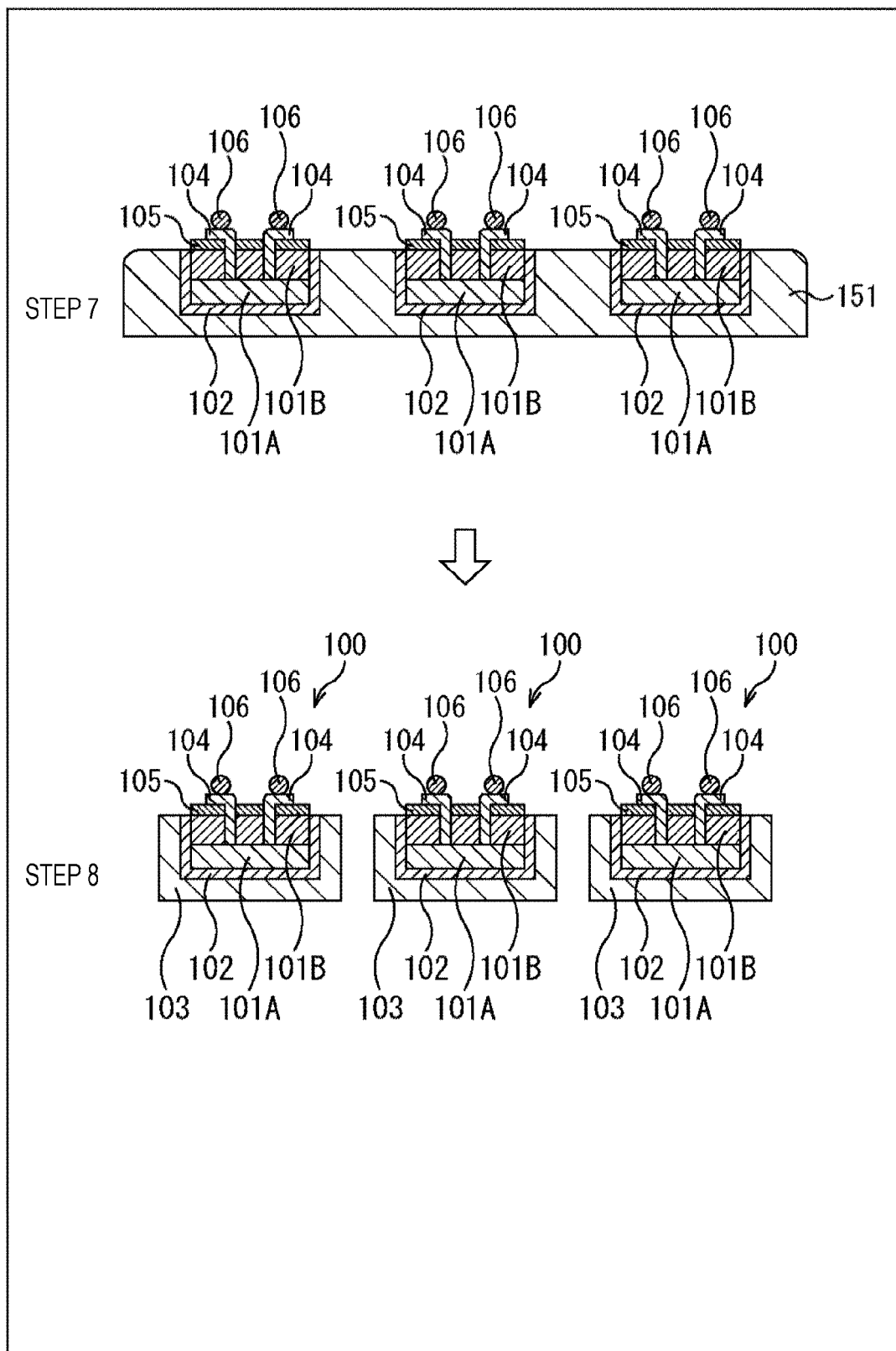
FIG. 4 is a diagram for explaining the manufacturing method of the semiconductor device in FIG. 1.

In step 9, similarly to step 7 in FIG. 4, the thickness of the glass substrate 151 is reduced, and the glass substrate 151 is thinned. Note that, it is not necessary to perform step 9. Furthermore, step 9 may be performed between steps 6 and 7.

In step 10, dicing is performed. In other words, the glass substrates 151 and 451 are cut between the adjacent semiconductor chips 101, and the semiconductor device 400 is divided into individual pieces.

Note that the above steps may be performed by a single company or factory, and may be separately performed by a plurality of companies or factories. For example, it is possible that the single company or factory performs steps 1 to 5, 1 to 6, 1 to 8 or 1 to 9 and the substrate (integrated substrate), on which the plurality of semiconductor chips 101 is provided, obtained at that stage is shipped, and the subsequent steps may be performed by the other company or factory.

As described above, since surrounding of the semiconductor device 400 is almost completely covered with the protective member 103 and the protective member 402, water resistance is further improved.

Furthermore, since only the glass substrates 151 and 451 are cut in the dicing step, the workability is excellent, and quality of the semiconductor device 100 is improved.

5. Fifth Embodiment

Next, a fifth embodiment of the present technology will be described with reference to FIGS. 10 to 14.

{Exemplary Configuration of Semiconductor Device 500a}

Figure 10:
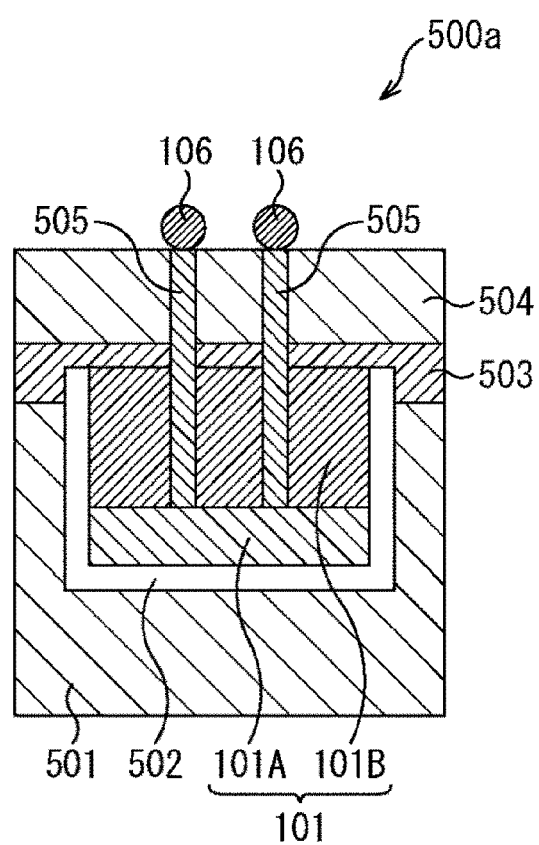
FIG. 10 is a schematic cross-sectional diagram of a fifth embodiment of a semiconductor device to which the present technology is applied.
Figure 11:
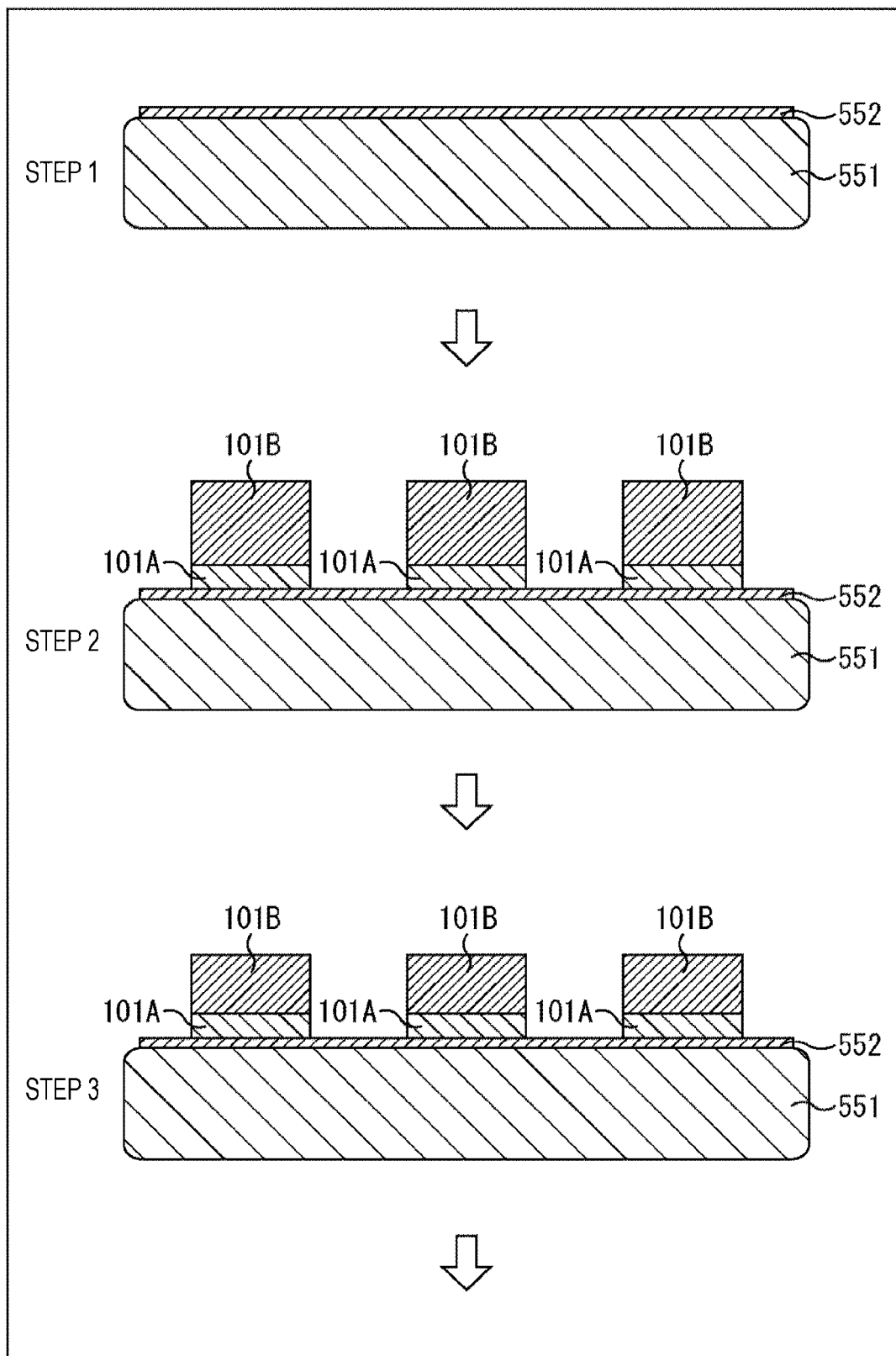
FIG. 11 is a diagram for explaining a manufacturing method of the semiconductor device in FIG. 10.

FIG. 10 is a schematic cross-sectional diagram of a semiconductor device 500a to which the present technology is applied. Note that, in FIG. 10, components corresponding to those in FIG. 7 are respectively denoted with the same reference numerals.

The semiconductor device 500a is different from the semiconductor device 400 in FIG. 7 in that a protective member 501, an adhesion portion 503, a protective member 504, and a rewiring layer 505 are added instead of the protective member 103, the adhesion portion 401, the protective member 402, and the rewiring layer 403, the adhesion portion 102 is removed, and a gap 502 is provided.

The semiconductor device 500a is a semiconductor device having a so-called cavity structure in which the gap 502 is provided between a semiconductor chip 101 and the protective member 501.

In the semiconductor device 500a, an entire surface of a device portion 101A of the semiconductor chip 101 is covered with the glass protective member 501, and an entire surface of the semiconductor chip 101 except for upper ends of the side surfaces is covered with the protective member 501. Furthermore, the glass protective member 504 is bonded to a mounting surface of the semiconductor chip 101 via the adhesion portion 503, and the entire mounting surface of the semiconductor chip 101 is covered with the protective member 504. Furthermore, the protective member 504 covers the gap 502 and covers the entire surface of the protective member 501 on the side of the mounting surface of the semiconductor device 500a.

The rewiring layer 505 passes through a semiconductor substrate 101B, the adhesion portion 503, and the protective member 504 and connects the device portion 101A to the mounting surface of the semiconductor device 500a.

The solder ball 106 is provided on a portion of the rewiring layer 505 exposed from the protective member 504.

{Manufacturing Method of Semiconductor Device 500a}

Next, a manufacturing method of the semiconductor device 500a will be described with reference to FIGS. 11 to 14.

In step 1, an adhesive 552 is applied on an upper surface of a glass substrate 551.

In step 2, a surface of the semiconductor chip 101 on the side of the device portion 101A is bonded to the glass substrate 551 via the adhesive 552.

In step 3, a height of the semiconductor substrate 101B of the semiconductor chip 101 is lowered.

In step 4, an adhesive 554 is applied on an upper surface of a glass substrate 553 used for the protective member 504 of the semiconductor device 500a.

In step 5, the surface of the semiconductor chip 101 on the side of the semiconductor substrate 101B is bonded to the glass substrate 553 via the adhesive 554.

In step 6, the glass substrate 551 and the adhesive 552 are removed.

In step 7, potting is performed between the semiconductor chips 101 with the adhesive 554 on the bonding surface of the glass substrate 553.

In step 8, a glass substrate 555 used for the protective member 501 of the semiconductor device 500a is bonded to the glass substrate 553 via the adhesive 554 Here, a groove into which each semiconductor chip 101 is inserted is formed in the glass substrate 555. With this groove, side surfaces of the semiconductor chip 101 and the surface of the device portion 101A are covered with the glass substrate 555, and the gap 502 is formed between the semiconductor chip 101 and the glass substrate 555.

Furthermore, in step 7, by performing potting between the semiconductor chips 101 with the adhesive 554, the thickness of the adhesive 554 between the glass substrates 553 and 555 is thicker than the thickness of the adhesive 554 between the glass substrate 553 and the semiconductor chip 101. As a result, there is a portion which is not covered with the glass substrate 555 (protective member 501) at the end of the side surface of the semiconductor chip 101 on the side of the semiconductor substrate 101B.

In step 9, the glass substrate 553 is lowered. Note that the figure of step 9 is turned upside down from the figure of step 8.

In step 10, the rewiring layer 505 is formed. For example, the rewiring layer 505 to connect the mounting surface of the semiconductor device 500a to the device portion 101A is formed from the side of the glass substrate 553.

In step 11, the solder ball 106 to mount the semiconductor device 500a on the substrate is provided on a surface of the rewiring layer 505.

In step 12, dicing is performed. In other words, the glass substrates 553 and 555 are cut between the adjacent semiconductor chips 101, and the semiconductor device 500a is divided into individual pieces.

Note that the above steps may be performed by a single company or factory, and may be separately performed by a plurality of companies or factories. For example, it is possible that the single company or factory performs steps 1 to 8, 1 to 9, or 1 to 11 and the substrate (integrated substrate), on which the plurality of semiconductor chips 101 is provided, obtained at that stage is shipped, and the subsequent steps may be performed by the other company or factory.

As described above, in the semiconductor device 500a having a cavity structure, almost entire surface of the semiconductor chip 101 can be covered with the protective members 501 and 504, and water resistance is improved.

Furthermore, since only the glass substrates 553 and 555 are cut in the dicing step, the workability is excellent, and quality of the semiconductor device 500a is improved.

6. Sixth Embodiment

Next, a sixth embodiment of the present technology will be described with reference to FIGS. 15 and 16.

{Exemplary Configuration of Semiconductor Device 500b}

Figure 15:
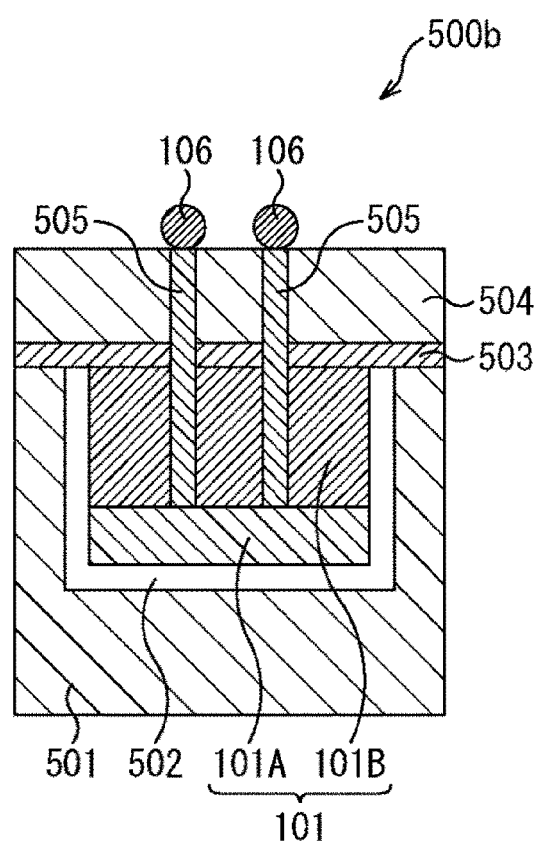
FIG. 15 is a schematic cross-sectional diagram of a sixth embodiment of a semiconductor device to which the present technology is applied.
Figure 16:
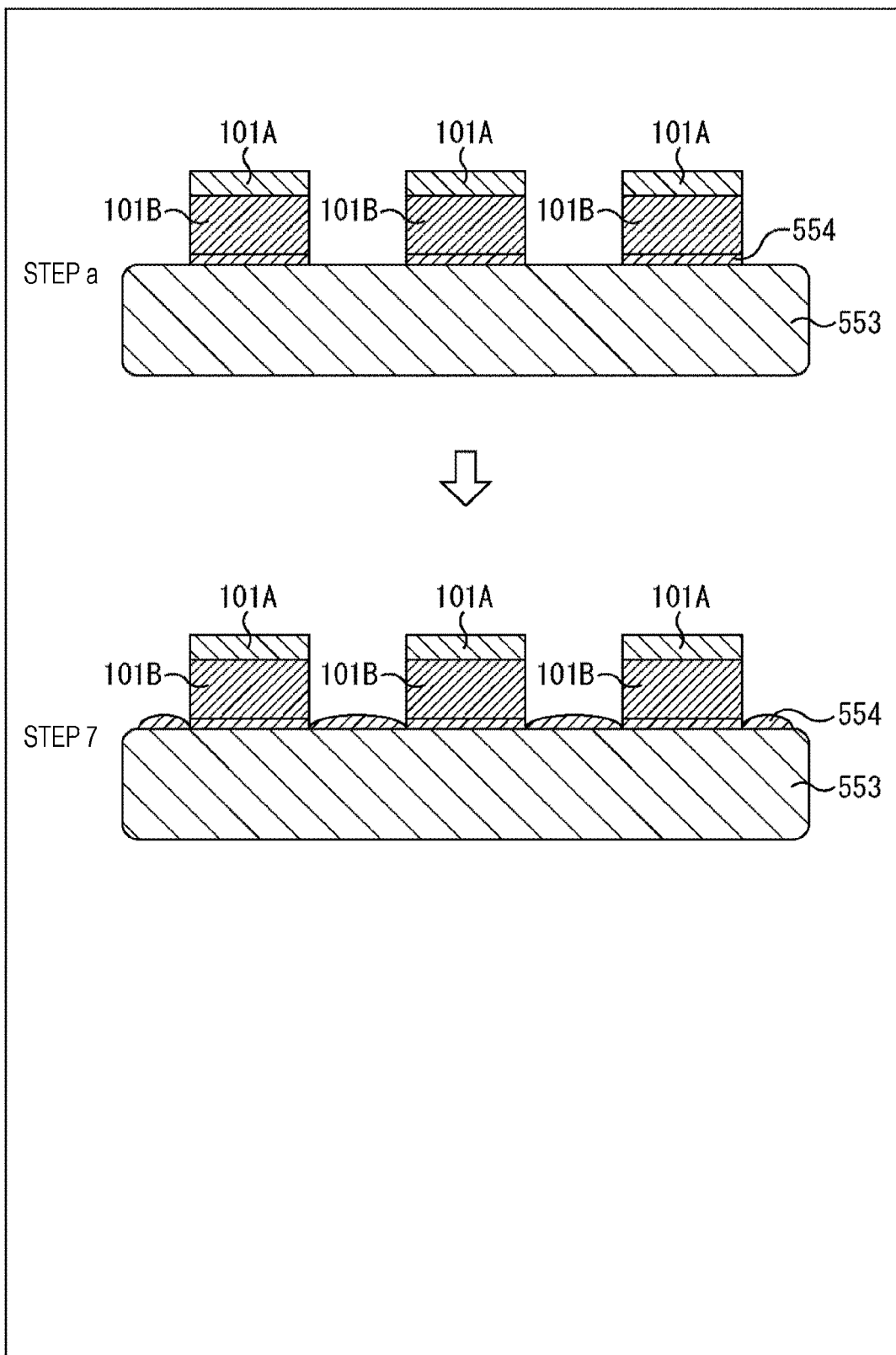
FIG. 16 is a diagram for explaining a manufacturing method of the semiconductor device in FIG. 15.

FIG. 15 is a schematic cross-sectional diagram of a semiconductor device 500b to which the present technology is applied. Note that, in FIG. 15, components corresponding to those in FIG. 10 are respectively denoted with the same reference numerals.

The semiconductor device 500b is different from the semiconductor device 500a in FIG. 10 in that a protective member 501 covers a semiconductor chip 101. In other words, in the semiconductor device 500b, side surfaces of the semiconductor chip 101 are completely covered with the protective member 501. Accordingly, water resistance of the semiconductor device 500b is further improved in comparison with the semiconductor device 500a.

{Manufacturing Method of Semiconductor Device 500b}

Next, a manufacturing method of the semiconductor device 500b will be described with reference to FIG. 16.

Figure 12:
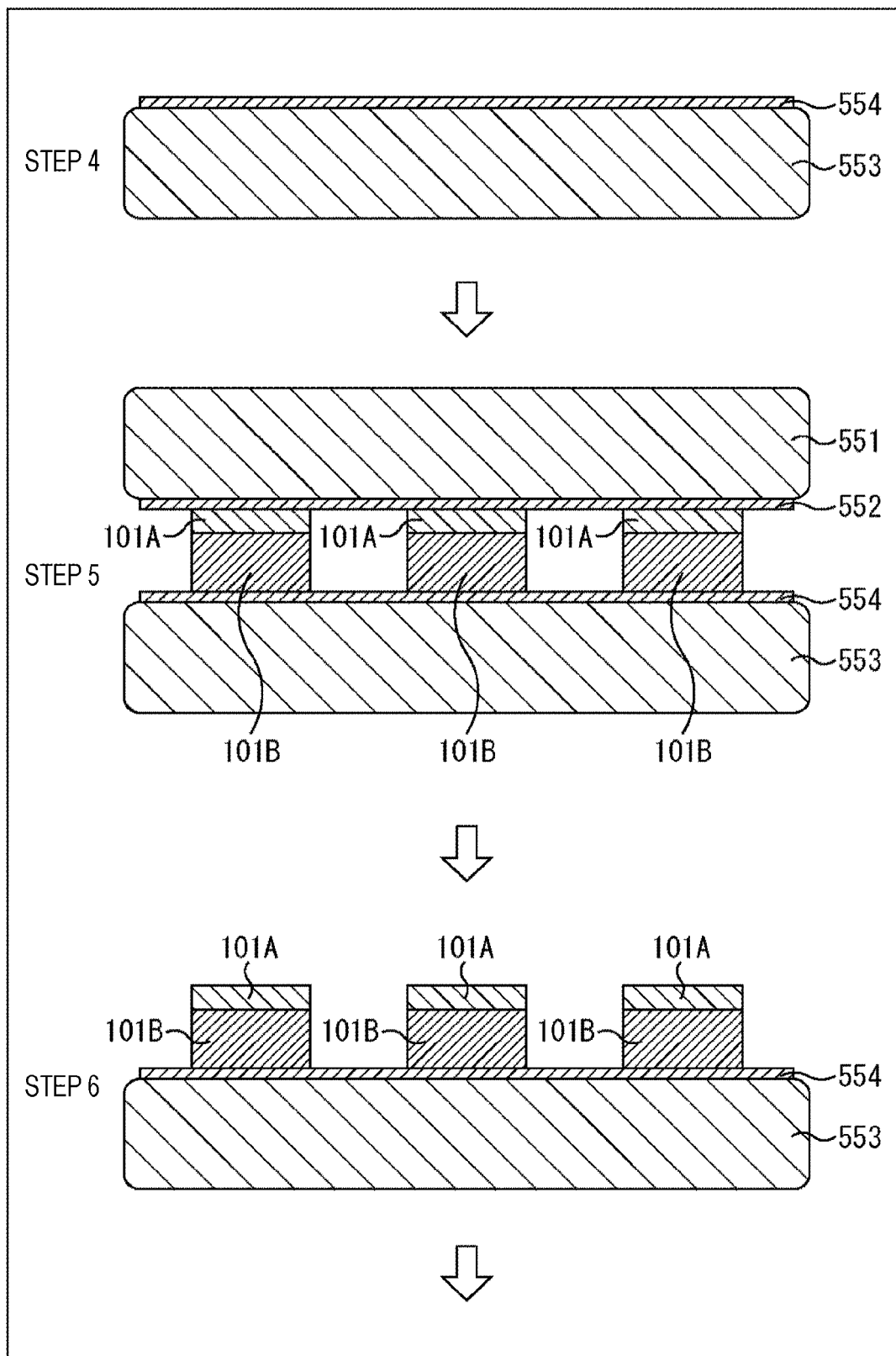
FIG. 12 is a diagram for explaining the manufacturing method of the semiconductor device in FIG. 10.
Figure 13:
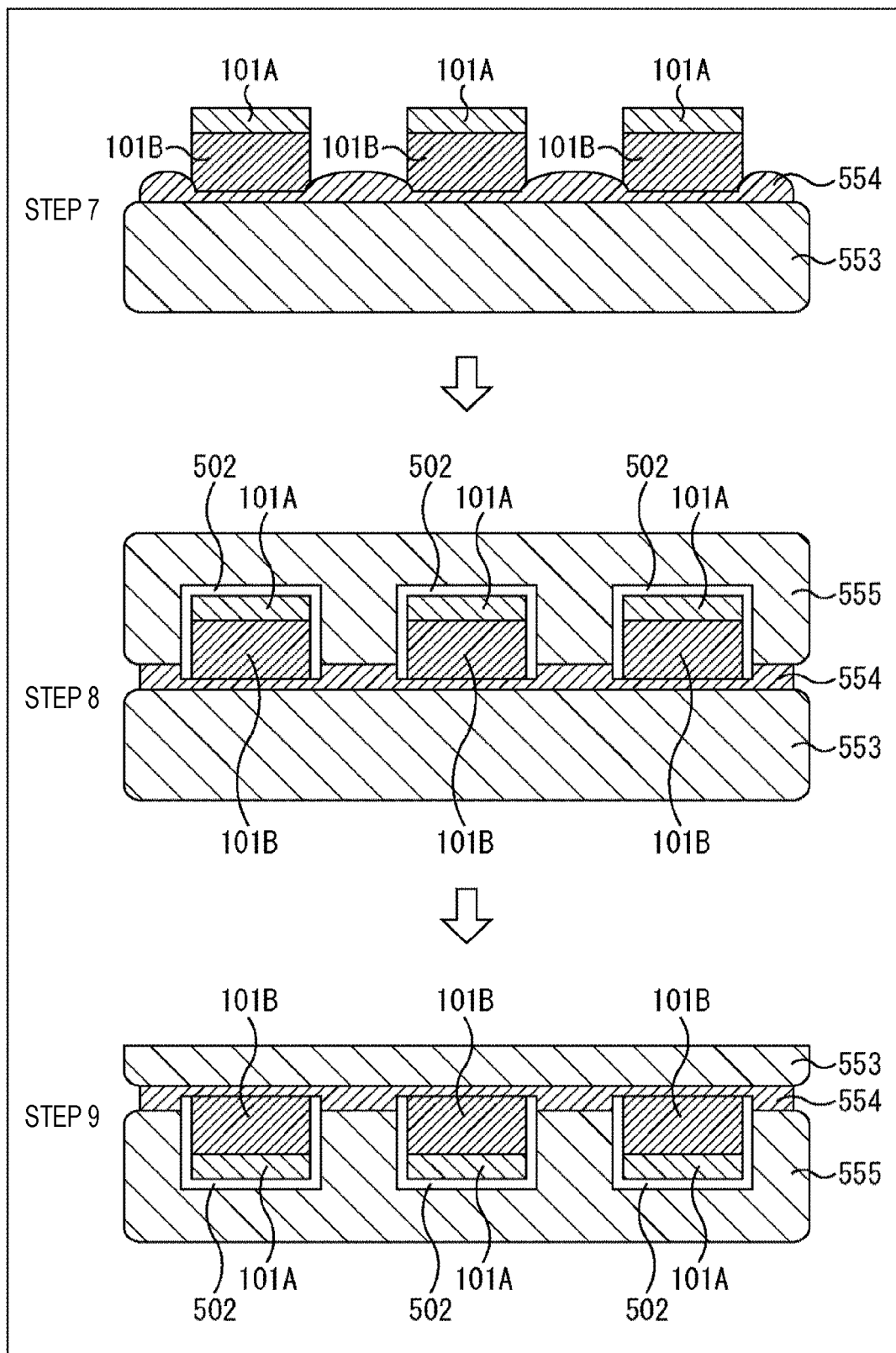
FIG. 13 is a diagram for explaining the manufacturing method of the semiconductor device in FIG. 10.
Figure 14:
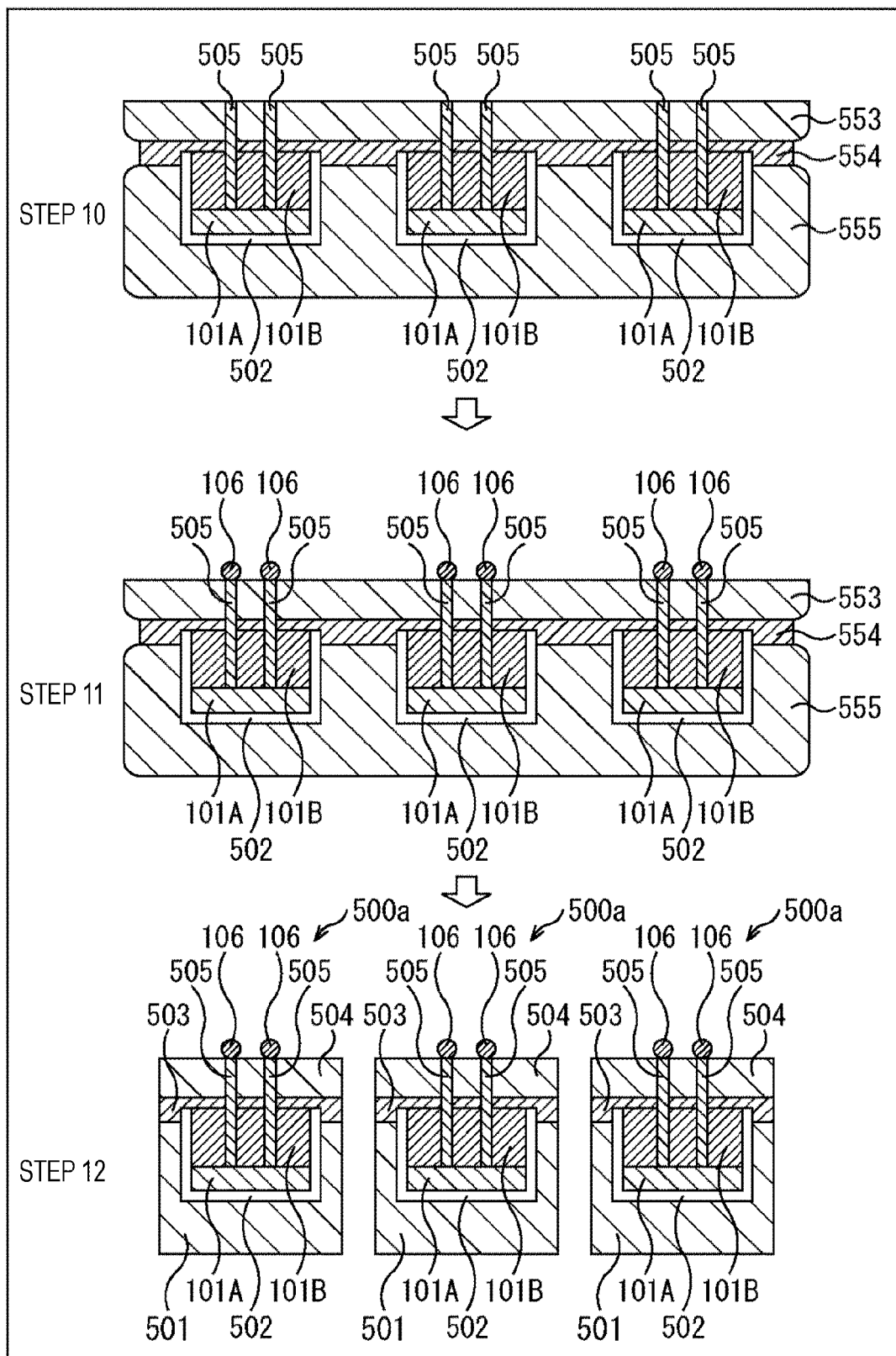
FIG. 14 is a diagram for explaining the manufacturing method of the semiconductor device in FIG. 10.

The manufacturing method of the semiconductor device 500b is different from the manufacturing method of the semiconductor device 500a in that step a is added between step 6 in FIG. 12 and step 7 in FIG. 13.

Specifically, in the step a, an adhesive 554 between the semiconductor chips 101 is removed from a bonding surface of a glass substrate 553.

Accordingly, when the potting is performed between the semiconductor chips 101 with the adhesive 554 in step 7, the amount of the adhesive 554 between the semiconductor chips 101 is smaller than that at the time of manufacturing the semiconductor device 500a. As a result, in step 8 (FIG. 13), when the glass substrate 555 is bonded to the glass substrate 553, the thickness of the adhesive 554 between the glass substrates 553 and 555 is substantially equal to the thickness of the adhesive 554 between the glass substrate 553 and the semiconductor chip 101. As a result, the side surfaces of the semiconductor chip 101 are completely covered with the glass substrate 555 (protective member 501).

7. Application Example of Present Technology

{Application Example to Imaging Element}

A semiconductor device to which the present technology is applied can be, for example, an imaging element as described above.

Figure 17:
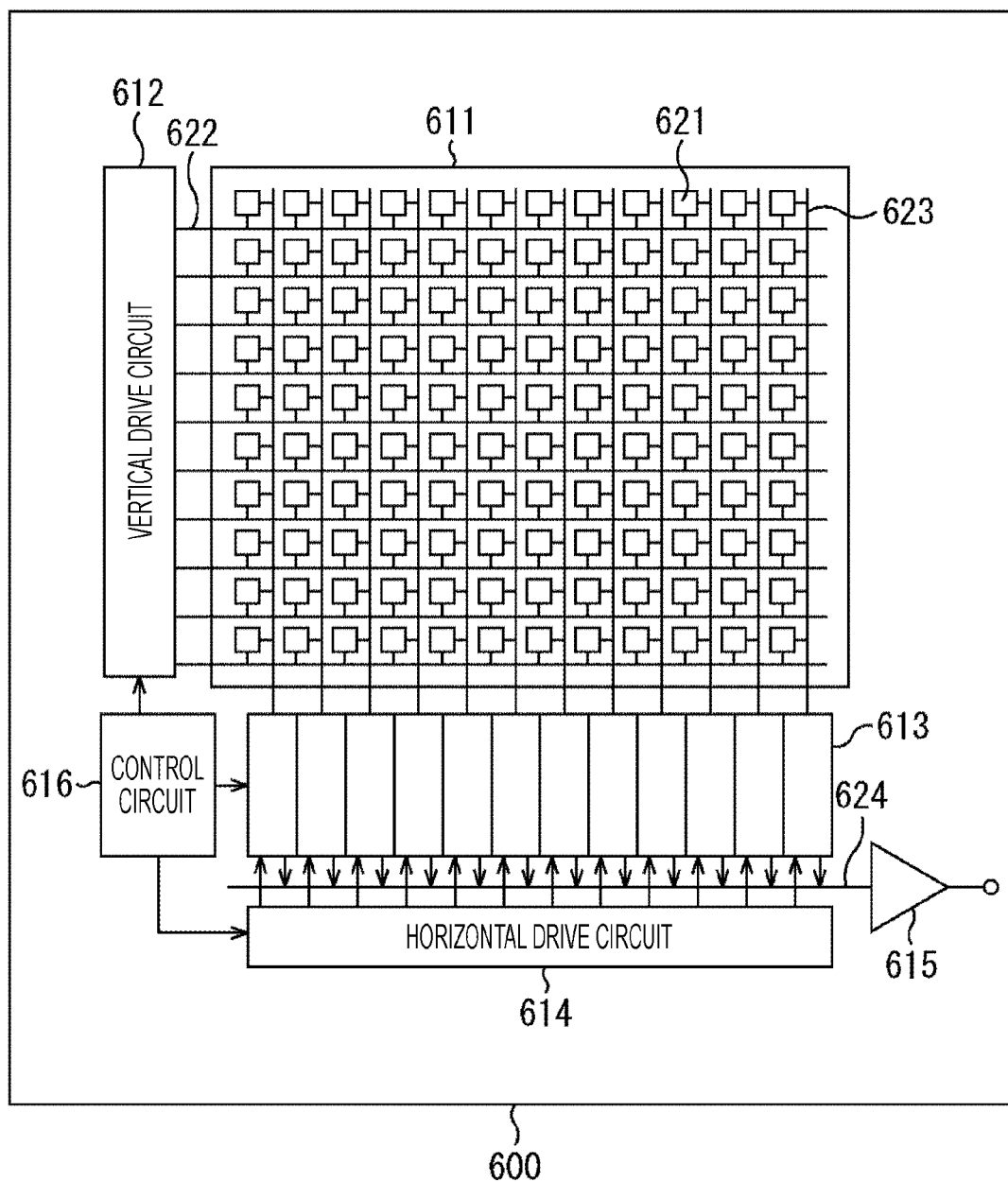
FIG. 17 is a block diagram of an exemplary schematic configuration of an imaging element to which the present technology is applied.

FIG. 17 is a block diagram of an exemplary configuration of an imaging element 600 to which the present technology is applied.

The imaging element 600 includes a pixel region 611, a vertical drive circuit 612, a column signal processing circuit 613, a horizontal drive circuit 614, an output circuit 615, and a control circuit 616.

The pixel region 611 is a light receiving surface for receiving light collected by an optical system (not shown). In the pixel region 611, a plurality of pixels 621 is arranged in a matrix, and each pixel 621 is connected to the vertical drive circuit 612 via a horizontal signal line 622 for each row and connected to the column signal processing circuit 613 via a vertical signal line 623 for each column. Each of the plurality of pixels 621 outputs a pixel signal according to the amount of the received light, and an image of an object to be formed on the pixel region 611 is constructed from the pixel signals.

The vertical drive circuit 612 supplies a drive signal to sequentially drive (transfer, select, reset, and the like) the plurality of pixels 621 arranged in the pixel region 611 for each row of the pixel 621 to the pixel 621 via the horizontal signal line 622. For example, the vertical drive circuit 612 controls an exposure time of each pixel 621 in the pixel region 611, reading scanning, and the like. Furthermore, for example, the vertical drive circuit 612 performs a plurality of lines of reading scanning in parallel on the pixel signals of the respective pixels 621 in the pixel region 611 as described later and controls a timing to shift a reading row to which each reading scanning is performed on the basis of the position of the reading row to which the other reading scanning is performed.

The column signal processing circuit 613 performs correlated double sampling (CDS) processing on the pixel signal output from each of the plurality of pixels 621 via the vertical signal line 623 to perform A/D conversion on the pixel signal and remove reset noise. For example, the column signal processing circuit 613 includes a plurality of column processing units (not shown) according to the number of columns of the pixels 621 and can perform CDS processing in parallel on the columns of the pixels 621.

The horizontal drive circuit 614 supplies a drive signal to make the column signal processing circuit 613 sequentially output the pixel signal to an output signal line 624 for each column of the plurality of pixels 621 arranged in the pixel region 611 to the column signal processing circuit 613.

The output circuit 615 amplifies the pixel signal supplied from the column signal processing circuit 613 via the output signal line 624 at a timing according to the drive signal of the horizontal drive circuit 614 and outputs the amplified signal to a signal processing circuit in a subsequent stage.

The control circuit 616 controls drive of each unit in the imaging element 600. For example, the control circuit 616 generates a clock signal according to a drive cycle of each unit and supplies the signal to each unit.

Figure 18:
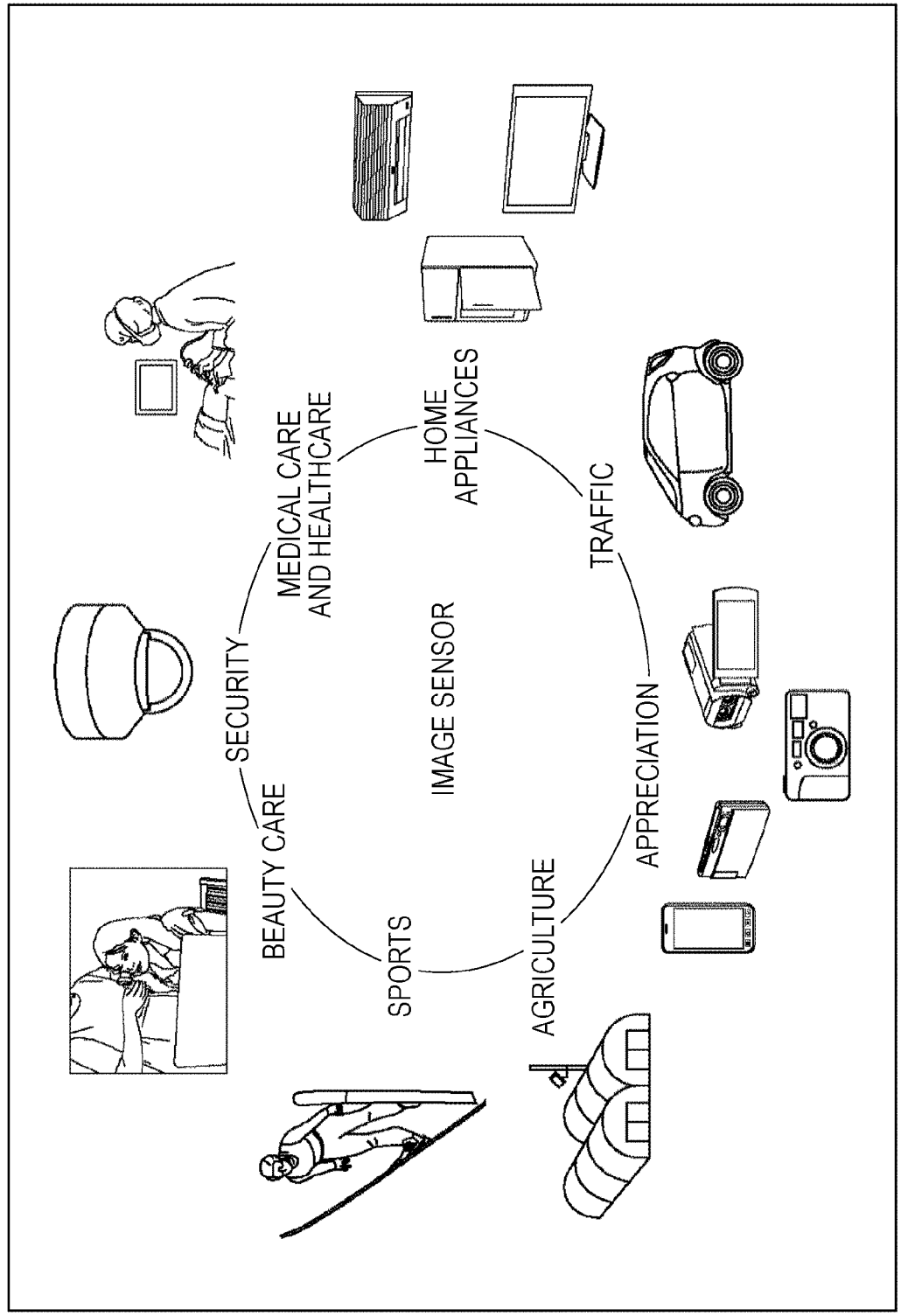
FIG. 18 is a diagram of exemplary usages of an image sensor.

FIG. 18 is a diagram of an exemplary usage of the imaging element 600.

The imaging element 600 described above can be used, for example, in various cases in which light such as visible light, infrared light, ultraviolet light, and X-rays are sensed as follows.

Figure 19:
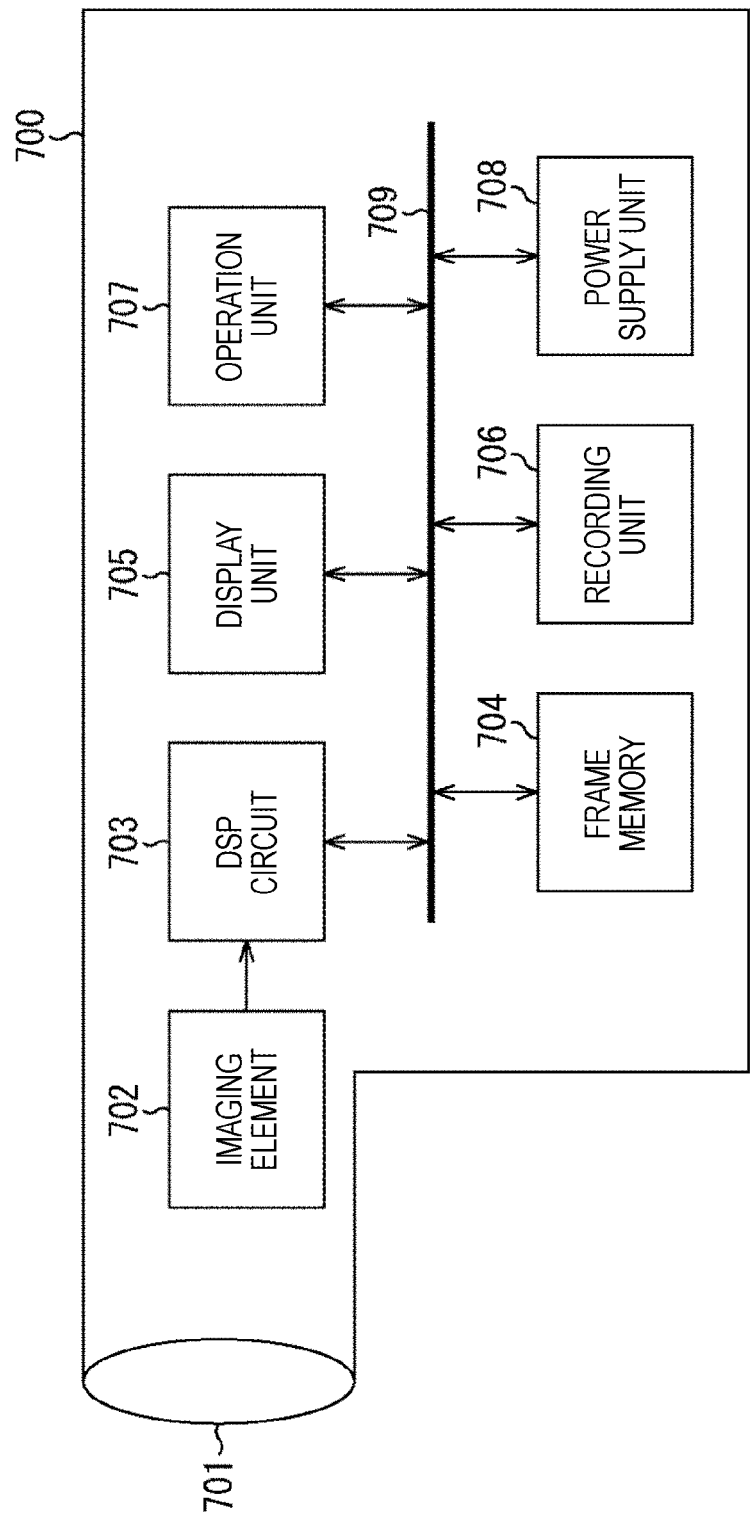
FIG. 19 is a block diagram of an exemplary configuration of an electronic device to which the present technology is applied.

- A device which images an image to be used for appreciation, such as a digital camera and a portable device with a camera function
- A device which is used for traffic, such as an in-vehicle sensor for imaging the front, rear, surroundings, inside, and the like of a car for safe driving such as automatic stop, recognition of a driver's state, and the like, a monitoring camera for monitoring a traveling vehicle and a road, a distance measuring sensor for measuring a distance between vehicles, and the like
- A device which is used for home appliances, such as a TV, a refrigerator, an air conditioner to image a gesture of a user and operates the device according to the gesture
- A device which is used for medical care and healthcare, such as an endoscope, a device for performing angiography by receiving infrared light
- A device which is used for security, such as a security monitoring camera and a camera for person authentication
- A device which is used for beauty care, such as a skin measuring instrument for photographing skin and a microscope for photographing a scalp
- A device which is used for sports, such as an action camera and a wearable camera for sports and the like
- A device which is used for agriculture, such as a camera for monitoring conditions of fields and crops FIG. 19 is a diagram of an exemplary configuration of an electronic device 700 to which the imaging element is applied.

The electronic device 700 is, for example, an imaging device such as a digital still camera and a video camera, a mobile terminal device such as a smartphone and a tablet type terminal, and the like.

In FIG. 19, the electronic device 700 includes a lens 701, an imaging element 702, a DSP circuit 703, a frame memory 704, a display unit 705, a recording unit 706, an operation unit 707, and a power supply unit 708. Furthermore, in the electronic device 700, the DSP circuit 703, the frame memory 704, the display unit 705, the recording unit 706, the operation unit 707, and the power supply unit 708 are mutually connected via a bus line 709.

Then, as the imaging element 702, the imaging element 600 in FIG. 18 can be applied.

The DSP circuit 703 is a signal processing circuit for processing a signal supplied from the imaging element 702. The DSP circuit 703 outputs image data obtained by processing the signal from the imaging element 702. The frame memory 704 temporarily holds the image data processed by the DSP circuit 703 in frame units.

The display unit 705 includes, for example, a panel type display device such as a liquid crystal panel and an organic electro luminescence (EL) panel and displays a moving image or a still image imaged by the imaging element 702. The recording unit 706 records the image data of the moving image or the still image imaged by the imaging element 702 to a recording medium such as a semiconductor memory or a hard disk.

The operation unit 707 outputs an operation instruction regarding various functions of the electronic device 700 according to a user's operation. The power supply unit 708 appropriately supplies various power sources to be an operation power source of the DSP circuit 703, the frame memory 704, the display unit 705, the recording unit 706, and the operation unit 707 to these components which are supply targets.

Note that a kind, a configuration, and the like of the imaging element to which the present technology is applied are not limited to the above example, and can be optionally changed.

For example, the present technology can be applied to various imaging elements such as a CMOS image sensor and a CCD image sensor.

Furthermore, the present technology can be applied to, for example, both of a surface irradiation type and a rear surface irradiation type CMOS image sensors.

Other Application Examples

Furthermore, the semiconductor device to which the present technology is applied can be applied to, for example, a light emitting device (for example, LED), a display device (for example, LCD panel and organic EL panel), and the like.

For example, in a case where the present technology is applied to the light emitting device, the device portion 101A of the semiconductor chip 101 forms a light emitting circuit, and the semiconductor substrate 101B forms a rear surface of the light emitting unit. Similarly, for example, the device portion 301B of the semiconductor chip 301 forms a light emitting circuit, and the semiconductor substrate 301C forms a rear surface of the light emitting unit.

Furthermore, for example, in a case where the present technology is applied to the display device, the device portion 101A of the semiconductor chip 101 forms a display circuit, and the semiconductor substrate 101B forms a rear surface of the display unit. Similarly, for example, the device portion 301B of the semiconductor chip 301 forms a display circuit, and the semiconductor substrate 301C forms a rear surface of the display unit.

8. Modification

In the above description, an example has been described in which glass is used for the protective member to protect the semiconductor chips 101 and 301. However, a transparent member having moisture resistance other than glass may be used. Note that a member, like glass, having high cutting workability is desired.

Furthermore, in the above description, an example has been described in which the semiconductor chip 101 or 301 is bonded to the glass substrate with an adhesive. However, for example, the semiconductor chip and the glass substrate can be bonded to each other with a method other than bonding with the adhesive. For example, by making the surface of the semiconductor chip 101 or 301 and the inner surface of each groove in the glass substrate be sufficiently flat, the semiconductor chip and the glass substrate can be bonded with intermolecular forces between the surfaces to be bonded.

Note that an embodiment of the present technology is not limited to the embodiments described above, and various modifications can be made without departing from the scope of the present technology.

Furthermore, for example, the present technology can have the configuration below.

(1) A semiconductor device including:
  a semiconductor chip; and
  a protective member that is a transparent protective member having moisture resistance configured to cover at least one of a first surface perpendicular to a side surface of the semiconductor chip or a second surface opposite to the first surface and the side surfaces.

(2) The semiconductor device according to (1), further including:
  a wiring layer formed from a side of one of the first surface and the second surface which is not covered with the protective member.

(3) The semiconductor device according to (2), further including:
  a protective film configured to cover an adhesion portion between the semiconductor chip and the protective member on the side of the surface which is not covered with the protective member.

(4) The semiconductor device according to (1), in which both of the first surface and the second surface are covered with the protective member, and
  the semiconductor device further includes a wiring layer formed on a side of the second surface of the protective member.

(5) The semiconductor device according to (4), in which a gap is provided between the first surface and the side surfaces, and the protective member.

(6) The semiconductor device according to any one of (1) to (5), in which
  the protective member includes glass.

(7) The semiconductor device according to any one of (1) to (6), in which
  the semiconductor chip configures an imaging element.

(8) A manufacturing method of a semiconductor device including:
  a groove forming step of forming a plurality of grooves into which a semiconductor chip is inserted into a predetermined surface of a first substrate that is a transparent substrate having moisture resistance;
  a first bonding step of bonding each of the plurality of semiconductor chips into the groove; and
  a lowering step of making a height of each semiconductor chip match a height of the predetermined surface of the substrate by lowering the height of at least one of the semiconductor chip or the substrate.

(9) The manufacturing method of a semiconductor device according to (8), further including:
a wiring step of forming a wiring layer of each of the semiconductor chips on the substrate from a side of the predetermined surface subsequent to the lowering step.

(10) The manufacturing method of a semiconductor device according to (8), further including:
a protective film forming step of forming a protective film around each of the semiconductor chips and on the predetermined surface of the first substrate subsequent to the lowering step.

(11) The manufacturing method of a semiconductor device according to (8), further including:
subsequent to the lowering step,
a second bonding step of bonding a second substrate configured of the same material as the first substrate on the predetermined surface of the first substrate; and
a wiring step of forming a wiring layer of each of the semiconductor chip from a side of the second substrate.

(12) The manufacturing method of a semiconductor device according to any one of (8) to (11), further including:
a cutting step of cutting and dividing the first substrate between adjacent semiconductor chips subsequent to the lowering step.

(13) A manufacturing method of a semiconductor device including:
a first bonding step of bonding a plurality of semiconductor chips on a predetermined surface of a first substrate that is a transparent substrate having moisture resistance; and
a second boding step of bonding a second substrate configured of the same material as the first substrate and including a plurality of grooves covering each of the semiconductor chips as having a gap with each of the semiconductor chips to the predetermined surface of the first substrate.

(14) The manufacturing method of a semiconductor device according to (13), further including:
a wiring step of forming a wiring layer of each of the semiconductor chips from a side of the first substrate subsequent to the second bonding step.

(15) The manufacturing method of a semiconductor device according to (13) or (14), further including:
a cutting step of cutting and dividing the first substrate and the second substrate between the adjacent semiconductor chips subsequent to the wiring step.

(16) An integrated substrate including:
a first substrate that is a transparent substrate having moisture resistance and has a plurality of grooves formed on a predetermined surface; and
a plurality of semiconductor chips arranged in the grooves of the substrate and including a side surface and a first surface perpendicular to the side surface covered with an inner surface of the groove.

(17) The integrated substrate according to (16), further including:
a second substrate configured of the same material as the first substrate, bonded to the predetermined surface of the first substrate, and covering a second surface of each of the semiconductor chips opposite to the first surface.

(18) The integrated substrate according to (17), in which a gap is provided between each of the semiconductor chips and he groove of the first substrate.

(19) The integrated substrate according to any one of (16) to (18), in which
the first substrate includes glass.

(20) An electronic device including:
a semiconductor device;
a signal processing unit configured to process a signal of the semiconductor device, in which
the semiconductor device includes:
a semiconductor chip; and
a protective member that is a transparent protective member having moisture resistance configured to cover at least one of a first surface perpendicular to a side surface of the semiconductor chip or a second surface opposite to the first surface and the side surfaces.

REFERENCE SIGNS LIST 100 semiconductor device
101 semiconductor chip
101A device portion
101B semiconductor substrate
102 adhesion portion
103 protective member
104 rewiring layer
105 solder mask
106 solder ball
151 glass substrate
151A groove
152 adhesive
200 semiconductor device
201 protective film
300 semiconductor device
301 semiconductor chip
301A cover glass
301B device portion
301C semiconductor substrate
400 semiconductor device
401 adhesion portion
402 protective member
403 rewiring layer
451 glass substrate
500a, 500b semiconductor device
501 protective member
502 gap
503 adhesion portion
504 protective member
505 rewiring layer
551 glass substrate
552 adhesive
553 glass substrate
554 adhesive
555 glass substrate
600 imaging element
700 electronic device
702 imaging element

The invention claimed is:
1. A semiconductor device comprising:
a semiconductor chip including a device portion and a support portion that supports the device portion;
a first protective member that is transparent and that covers a side surface of the semiconductor chip and a first surface of the semiconductor chip perpendicular to the side surface;
a second protective member that covers a second surface of the semiconductor chip opposite to the first surface; and
a wiring formed through the second protective member and the support portion and electrically connected to the device portion.

2. The semiconductor device according to claim 1, further comprising:
   an adhesive between the second protective member and the second surface of the semiconductor chip and that adheres the semiconductor chip to the second protective member.

3. The semiconductor device according to claim 2, wherein the wiring is formed through the adhesive.

4. The semiconductor device according to claim 1, further comprising:
   a solder ball on the wiring.

5. The semiconductor device according to claim 4, wherein a gap is provided between the first surface and the side surface, and the first protective member.

6. The semiconductor device according to claim 1, wherein the first protective member includes glass.

7. The semiconductor device according to claim 1, wherein the device portion includes a photodiode.

8. An electronic device comprising:
   a semiconductor device; and
   a signal processing unit configured to process a signal of the semiconductor device, wherein
   the semiconductor device includes:
   a semiconductor chip including a device portion and a support portion that supports the device portion;
   a first protective member that is transparent and that covers a side surface of the semiconductor chip and a first surface of the semiconductor chip perpendicular to the side surface;
   a second protective member that covers a second surface of the semiconductor chip opposite to the first surface; and
   a wiring formed through the second protective member and the support portion and electrically connected to the device portion.

* * * * *